United States Patent [19]

Krauss et al.

[11] Patent Number: 4,879,684
[45] Date of Patent: Nov. 7, 1989

[54] WRITE-READ CIRCUIT

[75] Inventors: Mathias Krauss; Horst-Guenter Schniek, both of Dresden, German Democratic Rep.

[73] Assignee: Jenoptik Jena GmbH, Jena, German Democratic Rep.

[21] Appl. No.: 168,842

[22] Filed: Mar. 16, 1988

[30] Foreign Application Priority Data

Apr. 16, 1987 [DD] German Democratic Rep. ...................................... 3018814

[51] Int. Cl.$^4$ .............................................. G11C 7/00
[52] U.S. Cl. ........................... 365/189.11; 365/230.03
[58] Field of Search ............... 365/189, 154, 156, 190, 365/203, 177, 189.11, 230.03

[56] References Cited

U.S. PATENT DOCUMENTS 4,575,823  3/1986  Fitzpatrick ................. 365/189.11 X Primary Examiner—Joseph A. Popek
Attorney, Agent, or Firm—Jordan and Hamburg

[57] ABSTRACT

A read-write circuit has two data lines each of which is associated with a read circuit. The read circuit consists of three transistors connected in series, which operate in the low-signal mode in reading. By taking current from or into the bit lines according to the previously stored information the voltage ratios are changed at the outputs by which a data output driver is controlled. In writing, the n-transistors in the read circuits form with two p-transistors NOT circuits whose outputs form the data lines.

5 Claims, 3 Drawing Sheets

WRITE-READ CIRCUIT

The read-write circuit according to the invention is used in CMOS memory circuits, where it serves for the intermediate amplification of the signal on the bit line to be read, before it is given to the data output driver, and for writing the data that are taken from the data input buffer.

BACKGROUND OF THE INVENTION

The following criteria, which are substantially affected by the circuit technology of a read amplifier, can be considered in judging the quality of read-write circuits.

1. The speed of the reading process. It is to be noted that a small delay in a single access does not automatically entail a high data rate in other modes of operation, such as page mode or static column mode.

2. Current draw and space requirement are important especially when a plurality of read-write circuits are used; yet this is necessary due to the external organization (4-bit or 8-bit) but also due to the internal organization (block structure in the case of VLSI memories), or for making function testing effective in the so-called "test mode."

3. Limiting the level shift serves to reduce the power loss and to achieve a high speed, but it is important above all for the reduction of capacitative disturbances of the matrix.

For the reading out of information from the bit lines a variety of types of read amplifiers have been developed. In EP 130 910 there is described a read amplifier of the flip-flop type, in which two cross-coupled CMOS inverters, after a preset by a reference voltage, flip according to the signal on the data line. In that case, however, the data line is raised to the full voltage ($U_{cc}$ or $U_{es}$). The flip of the flip-flop is undesirable since high voltages have to be dissipated, even if only reading is done. A short delay in reading is possible in such circuits only in the case of optimal data line bias. Consequently such circuits are unsuitable for the rapid read-out of the information from the cells of a line without changing the column address (static column mode).

EP 180 193 describes a read amplifier which is composed of a pair of cross-coupled CMOS Schmitt Triggers. It is disadvantageous in this case also that the output voltages lag behind the input voltages, which in the static column mode leads to losses of speed.

Another possibility is the use of difference amplifiers, some of them multi-stage amplifiers, which by operating in the linear range fulfill an important requirement for a high speed in the static column mode. For this purpose, however, a relatively high forward current is necessary during the entire read process. Furthermore, here too a complete reversal of the data lines occurs unless this is prevented by additional circuitry (clamping circuits).

The aim of the invention is to develop a fast read-write circuit which will assure reading at a high data rate in the static column mode while requiring a minimum amount of space and a very small level shift on the data lines, and in which the write circuit is partially integrated into the read circuit.

SUMMARY OF THE INVENTION

The object of the invention is to provide a read-write circuit in which the read circuit operates in the small-signal mode. The output voltage will thus not lag behind the input voltage on the data line, so that the circuit will be suitable for the static column mode. The object includes the integration of the write circuit.

The read-write circuit is connected by two data lines and two selector transistors controlled each by the bit line decoder, each with one pair of bit lines each having a sensor flip-flop. Furthermore, the read-write circuit is connected by two data input lines to a data input buffer and by two data output lines to a data output driver. Within the read-write circuit a read circuit is associated with each data line.

According to the invention, in the read-write circuit the true data input line is connected through a first CMOS transfer gate opened by the writing, to the input of a first NOT circuit and through an n-transistor opened by the writing with crossover to the gate of a low-resistance n-transistor in the read circuit, which is associated with the negated data line. Also, the negated data input line is connected in like manner through a second CMOS transfer gate to the input of a second NOT circuit and through an n-transistor with crossover to the gate of a low-resistance n-transistor in the read circuit which is associated with the true data line. The two low-resistance n-transistors at the same time connect the data lines to ground.

The first NOT circuit triggers a low-resistance p-transistor which connects the supply voltage to the true data line and the second NOT circuit triggers another low-resistance p-transistor which connects the supply voltage to the negated data line. Finally, in each case an n-transistor which is blocked when writing is disposed between the inputs of the NOT circuits and the ground.

In development of the invention, two high-resistance p-transistors are provided which are triggered by the two NOT circuits. The p-transistors connect the supply voltage to the gate of the low-resistance n-transistor, which is associated with the inverse data line. The n-transistor thus receives the full level when triggered.

In development of the invention, a high-resistance p-transistor is disposed in each read circuit between the supply voltage and a junction, a low-resistance n-transistor controlled by a cycled reference voltage between the junction and the corresponding data line, and the above-mentioned low-resistance n-transistor between the data line and the ground, so that a series circuit of three transistors is the result.

In addition, an n-transistor which is blocked when writing connects the data line in question to the gate of the said n-transistor. Lastly, a transfer transistor, which is open when reading, connects the junction in question to the corresponding data output line.

When the read circuit is dimensioned in this manner, the transistors connected in series operate in the low-signal mode when a voltage $U_{ref} \approx 3U_T$ is applied, so that small changes in the potential on the data line produce a change in the division of the current and thus a change in output voltage.

In development of the invention the gates of the p-transistors in the read circuits are connected to the inverse data lines. Thus the output signal is reinforced.

In development of the invention an n-transistor is disposed between the supply voltage and the data line in question, and its gate is connected to the reference voltage. This transistor results in the working points (potential on the data lines and junctions) being established more rapidly after the end of a write than they are through only the high-resistance p-transistor in the read circuit.

BRIEF FIGURE DESCRIPTION

The invention will now be further explained in an embodiment and with the aid of the accompanying drawings, wherein.

Figure 3:
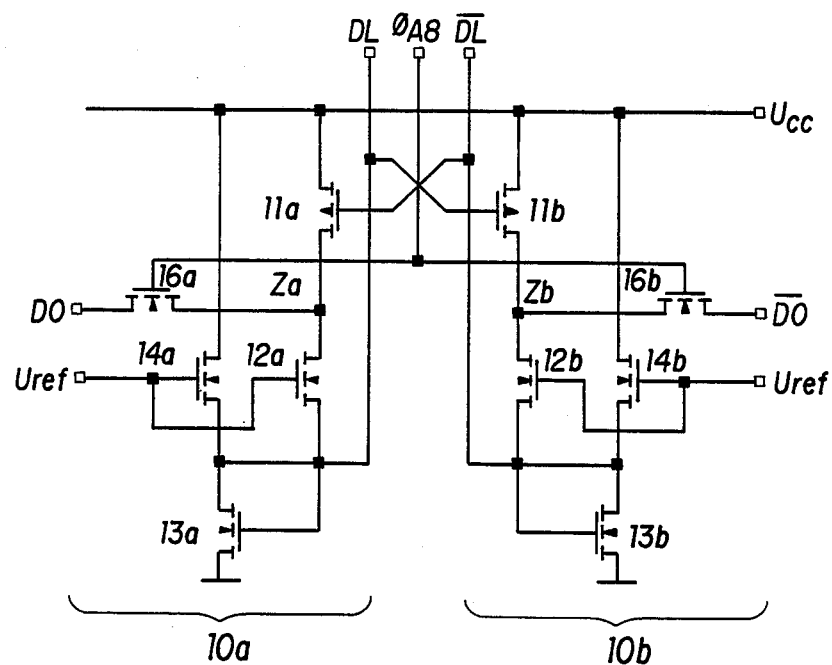
Figure 4:
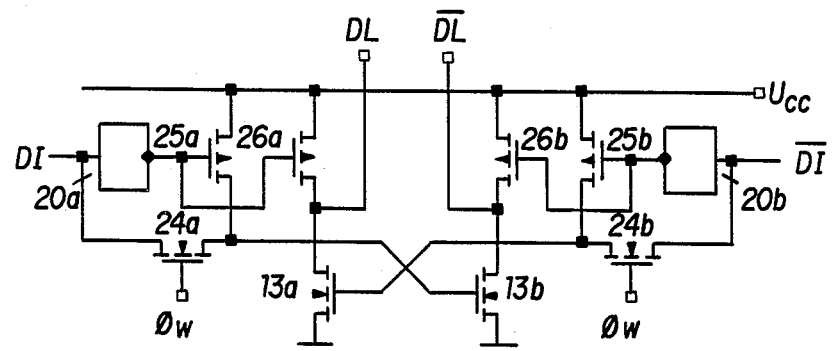

FIG. 3 the read-write circuit reduced by reading in the reading of a logical "1" on the true data line FIG. 4 the read-write circuit reduced by writing in the writing of a logical "1" on the true data line.

DETAILED DISCLOSURE OF THE INVENTION

Figure 1:
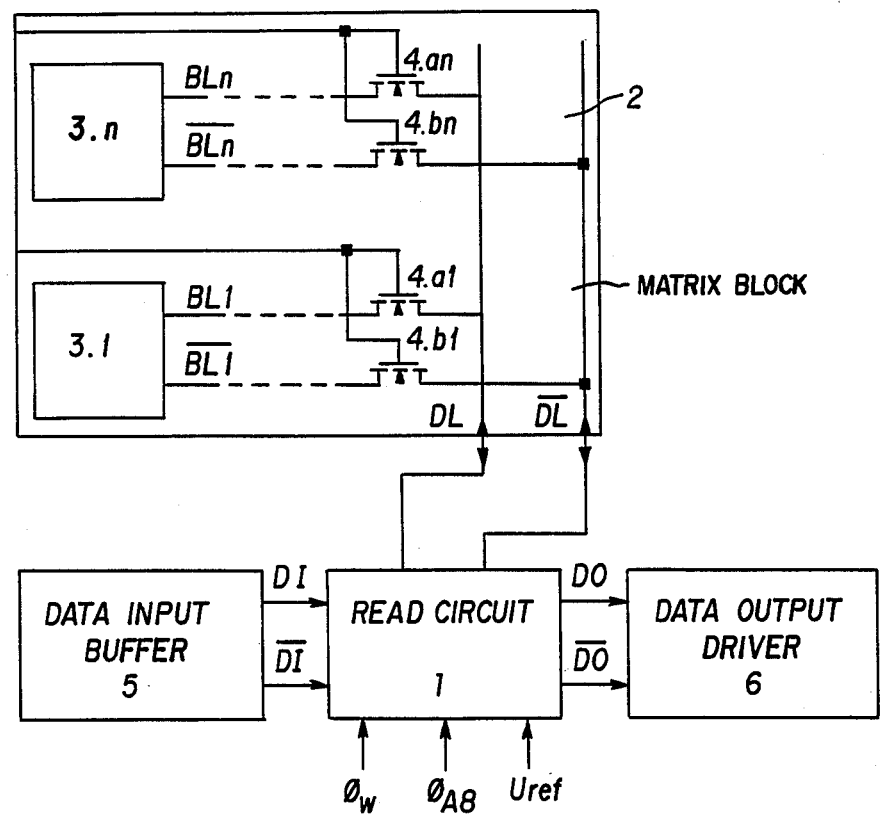
FIG. 1 is the block diagram showing a read-write circuit

FIG. 1 represents the block diagram for reading/writing. The read-write circuit 1 according to the invention is connected by two data lines DL, $\overline{DL}$ to a matrix block 2 of a memory matrix of a DRAM. Within the matrix block 2 are folded bit lines BL1 ... BLn, $\overline{BL1}$ ... $\overline{BLn}$, each connected with a sensor flip-flop 3.1 ... 3.n. The bit lines BL1 ... BLn, $\overline{BL1}$ ... $\overline{BLn}$ are connected through selector transistors 4a1 ... 4an, 4b1 ... 4bn to the data lines DL, $\overline{DL}$.

On the input side the read-write circuit 1 is connected through data input lines DI, $\overline{DI}$ to a data input buffer 5 and on the output side through data output lines DO, $\overline{DO}$ to a data output driver 6.

Figure 2:
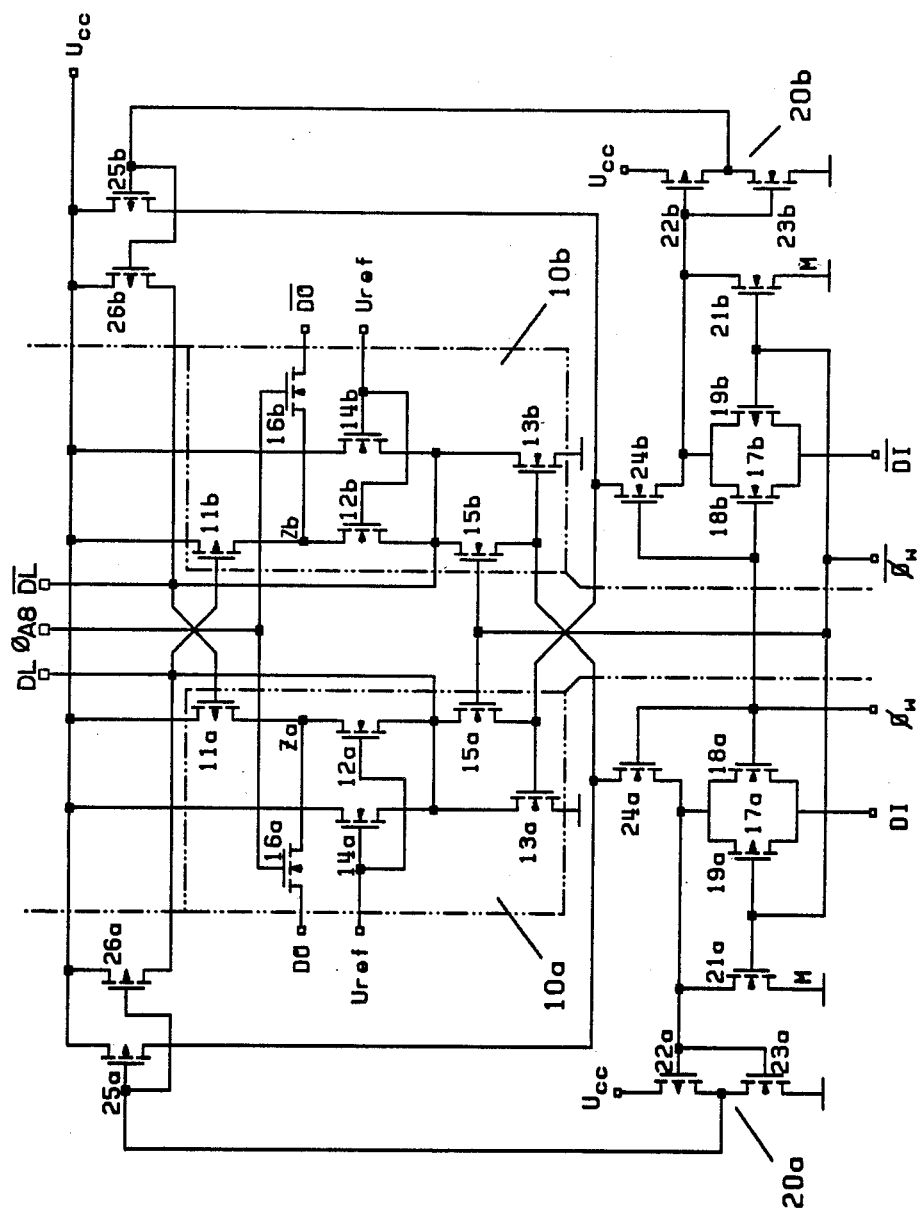
FIG. 2 shows the read-write circuit according to the invention

FIG. 2 represents the read-write circuit 1 according to the invention, which is constructed symmetrically with respect to the data lines DL, $\overline{DL}$. With the data line DL is associated a read circuit 10a, and, accordingly, with the data line $\overline{DL}$ a read circuit 10b.

In the read circuit 10a, 10b, between the supply voltage $U_{cc}$ and a junction Za, Zb there is disposed a high-resistance p-transistor 11a, 11b controlled by the inverse data line $\overline{DL}$, DL, and between the junction Za, Zb and the data line DL, $\overline{DL}$ a low-resistance n-transistor 12a, 12b controlled by a cycled reference voltage $U_{ref}$, and between the data line and the ground M another low-resistance transistor 13a, 13b is disposed in series.

Also, between the supply voltage $U_{cc}$ and the data line DL; $\overline{DL}$ is disposed an additional high-resistance n-transistor 14a, 14b controlled by the reference voltage $U_{ref}$. An n-transistor 15a, 15b controlled by the negated write cycle $\overline{\theta}W$ is disposed between the data line DL, $\overline{DL}$, and the gate of the n-transistor 13a, 13b.

From the address A8 a signal $\theta A8$ is derived, which is used for block selection in a memory of four matrix blocks 2 with each of which there is associated a read-write circuit 1.

Between the junctions Za, Zb, and the data output lines DO, $\overline{DO}$, there are transfer transistors 16a, 16b, controlled by the signal $\theta A8$).

The magnitude of the reference voltage $U_{ref}$ amounts to about three times a threshold voltage $U_T$. The data input lines DI and $\overline{DI}$ are connected through a transfer gate 17a, 17b, consisting of the n-transistors 18a, 18b controlled by the negated write cycle $\overline{\theta}w$ and the p-transistors 19a, 19b, controlled by the negated write cycle to the inputs of two NOT circuits 20a, 20b. Furthermore, two n-transistors 21a, 21b, controlled by the negated write cycle $\theta W$ connect the inputs of the NOT circuits 20a, 20b to the ground M and two n-transistors 24a, 24b, controlled by the write cycle $\theta w$ connect the inputs to the gates of the transistors 13b, 13a, which are associated with the inverse data lines. The NOT circuits 20a, 20b, consist each of one p-transistor 22a, 22b, and one n-transistor 23a, 23b.

A p-transistor 25a, 25b, controlled by the NOT circuit 20a, 20b, is disposed between the supply voltage $U_{cc}$ and the gate of the n-transistor 13b, 13a.

An additional p-transistor 26a, 26b, controlled by the NOT circuit 20a, 20b, is disposed between the supply voltage $U_{cc}$ and the data line DL, $\overline{DL}$.

The read-write circuit 1, reduced to illustrated a "read", is represented in FIG. 3.

In the operation of the memory outside of the reading, the write cycle $\theta W$ has the "low" potential and the negated write cycle $\overline{\theta}W$ has the "high" potential. The n-transistors 24a, 24b, are thus blocked and the transfer gates 16a, 17b cut off the data input lines DI, $\overline{DI}$. At the same time the inputs of the NOT circuits 20a, 20b are pulled by the n-transistors 21a, 21b to "low" so that the p-transistors 25a, 25b, 26a, 26b, are blocked.

Through the transistors 15a, 15b, the data lines DL, $\overline{DL}$, are connected to the gates of the n-transistors 13a, 13b, so that only the read circuits 10a, 10b can be activated.

As a result of the reference voltage $U_{ref}$, there exists present at the n-transistors 12a, 12b, and 14a, 14b, a bias potential of approximately $U_{ref}/2$ and approximately 1.5. $U_T$, respectively, this bias potential being sustained by a current flowing in both read circuits 10a, 10b.

Now, if the memory cell to be read contains the information of a logical "1," the bit line BL has "high" potential and the negated bit line $\overline{BL}$ "low," since the flip-flop sensor 3 has been actuated by the at first weak read signal. Then the selected bit lines BL, $\overline{BL}$, are connected through the selecting transistors 4a, 4b, to the data lines DL, $\overline{DL}$.

Since the bit line BL is carrying high and the negated bit line $\overline{BL}$ accordingly "low," an additional current is flowing through the selecting transistor 4a into the n-transistor 13a, so that the current is dropped by the n-transistor 12a below the preset current. On the other hand, an additional current flows from the n-transistor 12b through the selecting transistor 4b to the ground M, so that the n-transistor 12b causes the current to rise above the preset level. This contrary current change in the n-transistors 12a, 12b, is converted at the high-resistance load p-transistors 11a, 11b to a high contrary voltage change, this process being reinforced as a result of the operation of the p-transistors 11a, 11b, by the inverse data line DL, $\overline{DL}$. The potentials on data lines DL, $\overline{DL}$, are shifted only slightly from their working point (bias)($\pm 0.5 U_T \ldots \pm U_T$), which is an important requirement for a high data rate in reading in the static column mode (quasi-static operation).

Furthermore, the slight level shift on the data lines contributes to the reduction of capacitative disturbances in the memory matrix, which is important to the reliability of operation of highly integrated memories.

The transistors 14a, 14b, have the purpose of accelerating the establishment of the bias potential on the data lines after the reading and at the beginning of an access, by preventing any limiting of the charge current by the high-resistance p-transistors 11a, 11b. The read-write circuit (1), reduced to illustrate a "writing" operation, is represented in FIG. 4.

In the writing the write cycle $\theta w$ is high and the negated write cycle $\overline{\theta}W$ low, and also the reference voltage $U_{ref}$ is cut off. The data input lines DI, $\overline{DI}$, are thus connected to the inputs of the NOT circuits 20a and 20b. The n-transistors 15a, 15b, cut off the data lines DL, $\overline{DL}$, from the gates of the n-transistors 13a, 13b, and simultaneously the data input lines DI, $\overline{DI}$, are connected through the n-transistors 24a, 24b, to the gates of the n-transistors 13b, 13a.

Furthermore, the n-transistors 12a, 2b, and 14a, 14b, are controlled by the reference voltage $U_{ref}$, so that only the NOT circuits 20a, 20b, the p-transistors 25a, 25b, and two functional NOT circuits which consist of the p-transistors 26a, 26b and the n-transistors 13a, 13b, and whose outputs drive the data lines DL, $\overline{DL}$, can be activated.

The triggering of the p-transistors 26a, 26b, through the NOT circuits 20a, 20b, and the triggering of the n-transistors 13a, 13b, through the inverse data input line (DI, $\overline{DI}$) satisfies the requirement for a switching of the functional NOT circuits in a forward-current-free manner, which contributes to the reduction of power and of undesirable influences.

When the data input line DI is "high" the output of the NOT circuit 20a becomes "low" and the p-transistors 25a, 26a, open. Furthermore the n-transistor 13b is opened. In like manner the negated data input line $\overline{DI}$ triggers the n-transistor 13a into the blocked state and the p-transistors 25b, 26b, are blocked via the NOT circuit 20b, so that "high" level is established on the data line DL and "low" level on the data line $\overline{DL}$.

The p-transistors 25a, 25b, serve for the generation of the "high" level at the gates of the n-transistors 13a, 13b on write, which is not completely transferred by the n-transistors 24b, 24a.

We claim:

1. In a read-write circuit for a CMOS memory connected to the read-write circuit via first and second data memory lines and two selector transistors, the memory being controlled by a bit line decoder and having one pair of bit lines each connected to a sensor flip-flop, the read-write circuit being furthermore connected by first and second data input lines to a data input buffer and being connected by first and second data output lines to a data output driver, the read-write circuit including first and second read circuits associated with said first and second data memory lines, respectively, the improvement wherein the first and second data input lines are connected by first and second transfer gates to the inputs of first and second inverters and via first and second n-transistors, respectively, to the gates of third and fourth low-resistance n-transistors in the second and first read circuits, respectively, first and second low-resistance p-transistors being connected to the outputs of the first and second inverters, respectively, for connecting a supply voltage to the first and second data memory lines, respectively, and wherein fifth and sixth n-transistors are connected between the inputs of the first and second inverters and a ground reference, and further comprising means for rendering said first and second transfer gates conductive and rendering said fifth and sixth n-transistors non-conductive during writing to said memory.

2. The read-write circuit of claim 1, wherein third and fourth high-resistance p-transistors are connected between the supply voltage and the gates of the third and fourth n-transistors, the outputs of the first and second inverters being connected to the gates of the third and fourth p-transistors.

3. The read-write circuit of claim 1, wherein third and fourth high resistance p-transistors are connected in the first and second read circuits between the supply voltage and first and second functions, respectively, seventh and eighth low-resistance n-transistors are connected between the first and second junctions and the first and second data memory lines, said seventh and eighth n-transistors being controlled by a cycled reference voltage, and the fourth and third low-resistance n-transistors are connected between the first and second data memory lines and ground, and wherein ninth and tenth n-transistors connected to be non-conductive when writing to the memory connect the first and second data lines to the gates of the fourth and third n-transistors, and third and fourth transfer transistors connected to be conductive when reading from the memory connect the first and second junctions to the first and second output lines.

4. The read-write circuit of claim 3, wherein the gates of the third and fourth p-transistors are connected to the second and first data lines.

5. The read-write circuit of claim 1, wherein an n-transistor controlled by a reference voltage is connected between the supply voltage and one of the data memory lines.

* * * * *